United States Patent [19]

Konrad

[11] 4,021,718
[45] May 3, 1977

[54] BATTERY MONITORING APPARATUS

[75] Inventor: Charles Edward Konrad, Roanoke, Va.

[73] Assignee: General Electric Company, New York, N.Y.

[22] Filed: Aug. 21, 1975

[21] Appl. No.: 606,615

[52] U.S. Cl. .............................. 320/48; 324/29.5; 340/249

[51] Int. Cl.² .................... H02J 7/00; G01N 27/46

[58] Field of Search ................. 320/48, 31, 32, 39, 320/40, 43; 324/29.5; 340/249

[56] References Cited
UNITED STATES PATENTS

| | | | |
|---|---|---|---|
| 3,307,101 | 2/1967 | Byles | 320/48 X |
| 3,515,983 | 6/1970 | Lante | 324/29.5 |
| 3,593,099 | 7/1971 | Scholl | 320/48 X |
| 3,786,342 | 1/1974 | Molyneaux | 320/48 UX |

Primary Examiner—Robert J. Hickey
Attorney, Agent, or Firm—Walter C. Bernkopf; James H. Beusse

[57] ABSTRACT

A method and apparatus for continuously monitoring the remaining ampere hours of charge of a rechargeable battery. The invention utilizes a voltage monitoring system actuated by a current monitoring system to measure battery terminal voltage only when current discharge attains a predetermined level. The value of terminal voltage measured is stored and applied to an indicating device to yield a constant readout of battery state of charge.

13 Claims, 3 Drawing Figures

BATTERY MONITORING APPARATUS

BACKGROUND OF THE INVENTION

The present invention relates to battery monitoring apparatus and more particularly to a battery state-of-charge indicator.

Storage batteries are used in numerous applications where it is important to know the amount of available energy remaining in the battery. For example, a battery powered electric vehicle must rely upon the energy stored in the on-board batteries for propulsion and the replenishing of stored energy requires special equipment which is only available at a charging station. Thus, a means for indicating the energy state of the remaining battery charge can be advantageously used by the vehicle operator to ensure that the vehicle is returned to a charging station before the battery has been completely discharged. The vehicle batteries represent a substantial investment and the amortization of battery costs depends upon the available number of charge/discharge cycles and upon the average depth of discharge of a lead-acid battery. It is well known that the life of a battery is reduced significantly when it is repeatedly discharged such that the specific gravity of the electrolyte falls below 1180. Hence, it is desirable to provide some means for recognizing that the battery state-of-charge is approaching this level.

Prior art systems devised for indicating the energy remaining in a battery and/or detecting a low battery condition have fallen into three broad categories: damped voltmeters, battery condition monitors, and ampere-hour meters. None of these systems have proven entirely reliable or successful.

The use of a heavily damped voltmeter connected directly across the battery is the oldest and most commonly used indicator of the battery state-of-charge. The vehicle operator can often judge the battery charge condition by the magnitude of voltage drop during a specific manuever such as acceleration, but an accurate determination requires a high level of skill and close observation by an operator who is likely preoccupied with vehicular operation. Thus, a voltmeter arrangement is unsatisfactory because it requires a skilled operator for interpretation and in addition requires that a specific load be placed on the voltmeter at the time a reading is taken.

Battery condition monitors have been employed in some battery powered industrial trucks. These devices have a voltage level switch which is activated when the battery terminal voltage drops below a preset level (usually 80–85% of nominal voltage). Should the voltage remain below this level for a preset time interval, typically 15–30 seconds, an indicating lamp is energized and a second interval timer is started. After a second predetermined time interval, a specific work function is disabled so that no additional work can be accomplished, thereby forcing the operator to return to the charging station. A sensing and detection means of this type is inexact and dependent upon many variables, and, as a result, setting of the voltage trip-point and the two time delay intervals must be adjusted by trial and error. In addition, no continuous indicating means is available to advise the operator of the present state-of-charge and the low charge indication will often catch the operator by surprise.

A common type of instrument for continuously displaying the state-of-charge for battery powered vehicles is the ampere-hour meter. Battery-electric automobiles which were popular in the early part of this century included an ampere-hour meter which was reset by the ampere-hours of recharge. This early meter was an electromechanical unit, but more recent designs employ a solid-state version of the ampere-hour meter using a reversible electrochemical plating cell. In the electrochemical cell, charging of the battery plates a material at a rate corresponding to the magnitude of the discharge current so that the total plating is the product of current and time. During recharge, the plating is reversed in a similar fashion. For example, the ampere-hours (AH) available from a lead-acid battery depend upon the rate of discharge. Thus, a battery rated at 300 AH at a current drain which would deplete the charge in 6 hours may only provide 220AH at a current corresponding to a 1-hour discharge rate so that the ampere-hour meter may indicate that one-third of the energy is available when in fact the battery is completely discharged. In addition, discharged batteries are often exchanged at the charging station for a fully charged set and since the charging history of the new set is unknown, the meter cannot be properly reset. Furthermore, the ampere-hours recoverable from a fully-charged lead acid battery is dependent upon both the age and the temperature of the batteries. The use of ampere-hour meters cannot therefore provide a reliable indication of the energy remaining in the battery.

OBJECT OF THE INVENTION

It is an object of the present invention to provide an improved method and apparatus for continuously monitoring the state-of-charge of a rechargeable battery.

It is a further object of the present invention to provide an improved method and apparatus for displaying an indication of the energy remaining in the propulsion batteries of battery powered electric vehicles.

SUMMARY OF THE INVENTION

These and other objects are attained in accordance with the present invention by detecting the battery terminal voltage at a predetermined level of discharge current and storing a value representative of this voltage in an electronic counting circuit. Digital to analog voltage conversion is employed to convert the stored value indicative of battery state-of-charge into a proportionate deflection of an electromechanical indicator providing the operator with a visual display of energy remaining in the battery.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings in which:

DETAILED DESCRIPTION

Figure 1:
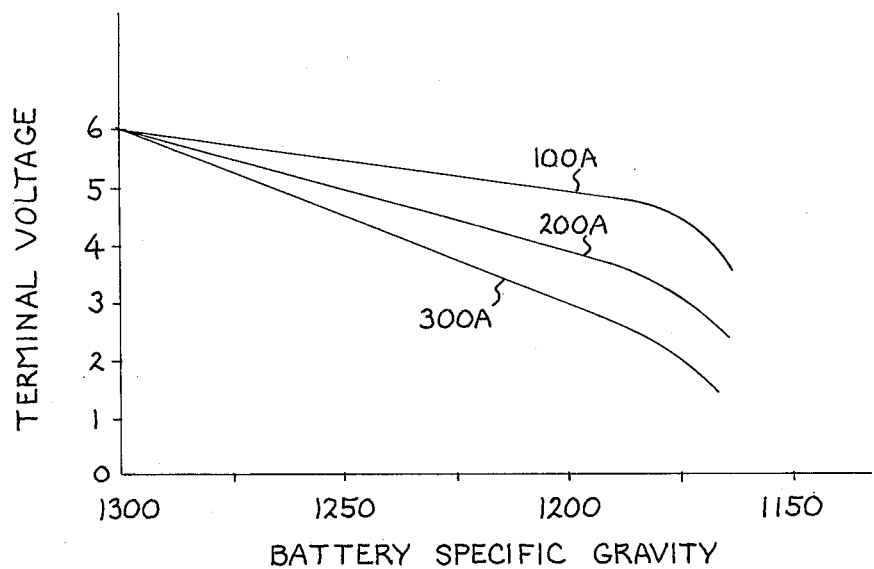
FIG. 1 is a representation of the relationship between battery terminal voltage and the specific gravity of the electrolyte at three levels of discharge current.

Referring now to FIG. 1 there is shown a typical relationship between battery terminal voltage and the specific gravity of the electrolyte in a lead acid battery. Terminal voltage is plotted on the vertical axis and specific gravity is plotted on the horizontal axis. It has been found that the drop in battery terminal voltage at a specified level of discharge current is a reliable indication of the battery state-of-charge in the electrolyte specific gravity range of 1300 (fully charged) to 1180 (maximum safe discharge), and more importantly, the relationship between the drop in terminal voltage and specific gravity is approximately linear between the fully charged and safely discharged states at a specified level of discharge current. For example, with a discharge current of 100 amperes represented by the upper locus 100A of FIG. 1, a battery terminal voltage of 6 volts corresponds to a specific gravity of 1300 and a terminal voltage of 5 volts corresponds to a specific gravity of 1180. The terminal voltage of 5.5 volts at a discharge current of 100 amperes corresponds to a specific gravity of 1240 characterizing a battery which has been 50% discharged. The lines labeled 200A and 300A represent, respectively, the battery discharge paths at 200 amperes and 300 amperes.

The use of terminal voltage at a specified discharge current for the determination of the state-of-charge is self-compensating for both battery aging and temperature variations since the two factors are reflected directly in the terminal voltage.

Figure 2:
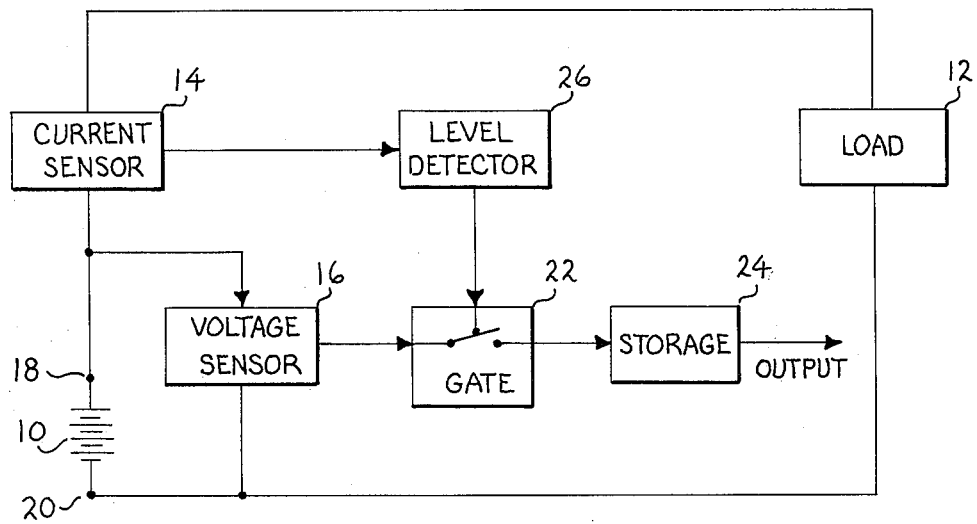
FIG. 2 is a block diagram of one embodiment of the invention.

Referring now to FIG. 2, there is shown a block diagram of a battery state-of-charge monitoring circuit according to the present invention in a system including a battery 10 connected to power a load 12. A current sensor 14 is connected in series relationship between the battery 10 and load 12 for producing an output signal representative of the battery discharge current level. A voltage sensor 16 is connected between the terminals 18 and 20 of battery 10 to provide an output signal proportional to battery terminal voltage. An analog gate 22 serves to connect an output terminal of voltage sensor 16 to an input terminal of a storage element 24 whenever the discharge current attains a specified level.

Operation of analog gate 22 is affected by a level detector 26 which detector 26 has an input terminal connected to an output terminal of current sensor 14. An output terminal of detector 26 is connected to a control terminal of gate 22 to thereby effect closure of the gate 22 when the discharge current from battery 10 attains a specified value. Closure of the gate 22 connects the voltage signal developed at the output terminal of voltage sensor 16 to the input terminal of storage element 24 whereby a value representative of this voltage signal level is stored by means, such as an electronic counter, until the discharge current again attains the predetermined level.

As indicated in FIG. 1, a definite correlation exists between the drop in terminal voltage at a specified level of battery discharge current and the specific gravity of the battery electrolyte. The relationship between the specific gravity of the electrolyte and the state-of-charge of a battery is well known in the art. The combination of current sensor 14 and level detector 26 provide a means for detecting a specified level of battery discharge current and outputting a closure signal to the analog gate 22. The closure of analog gate 22 serves to connect the output terminal of voltage sensor 16 to the input terminal of the storage unit 24 thereby providing a signal proportional to the drop in battery voltage to storage unit 24. When the battery discharge current is not equal to the specified level, the closure signal provided to the analog gate 21 by the level detector 26 is removed disconnecting the voltage sensor 16 output signal from the input to the storage unit 24. In this manner, the value retained in the storage unit 24 is proportional to the drop in battery terminal voltage measured when the discharge current is at the specified level. Should the magnitude of discharge current be other than the specified level, the value retained by storage unit 24 is proportional to the drop in battery terminal when the discharge current last attained the specified level.

During the normal operation of a battery powered vehicle, the level of battery discharge current will fluctuate over a wide range. The level of discharge current chosen as the predetermined level for monitoring the battery state-of-charge should be such that the discharge current attains the selected level frequently to thereby minimize the time interval between updating of the storage element 24. In this manner, the value retained in the storage element 24 will not differ significantly from the desired level. A predetermined discharge current which corresponds to the full load level running current has been found to be a suitable value for determining the battery state-of-charge.

The output of storage element 24 is a value representative of the battery state-of-charge and may be coupled to a variety of indicating devices and control means (not shown). Analog or digital metering can be employed to convert the stored value into a display which permits monitoring of the battery state-of-charge by the vehicle operator. Either analog or digital devices may also be employed to alert the operator to a low charge level or to disable specifc work functions of the vehicle when the output signal level of storage element 24 is less than a predetermined level indicative of a prescribed minimum desirable level of charge.

Figure 3:
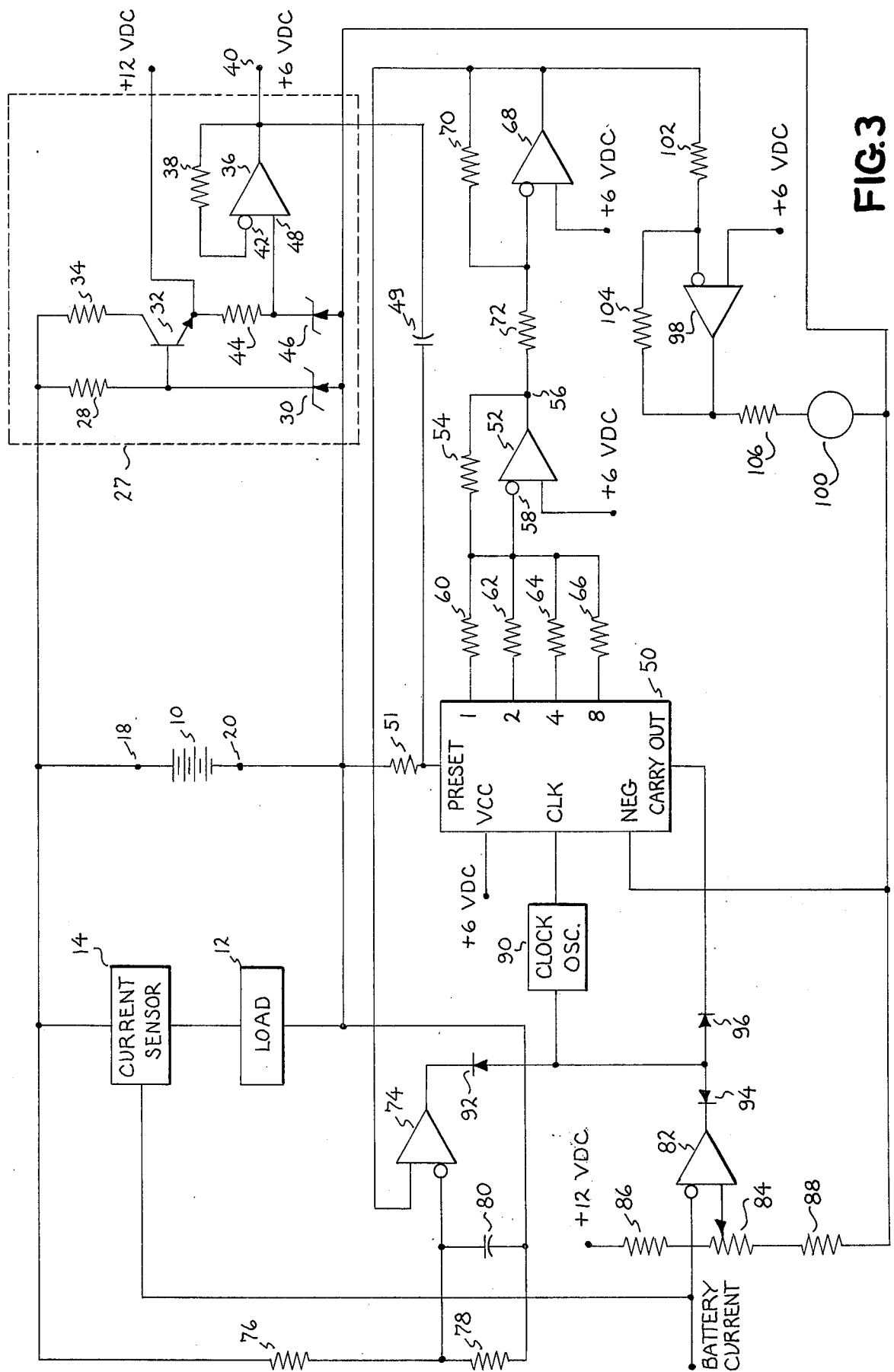
FIG. 3 is a more detailed schematic drawing of the embodiment of FIG. 2.

Referring now to FIG. 3, there is shown a more detailed diagram of one embodiment of the present invention. A regulated 6 volts is provided by a reference power supply 27 connected to battery 10. Power supply 27 comprises a series combination of a resistor 28 and a Zener diode 30 connected between the positive terminal 18 and the negative terminal 20 of battery 10 to provide a 12 volt reference for the base of a transistor 32. The collector terminal of transistor 32 is connected through a dropping resistor 34 to battery positive terminal 18. The emitter terminal of transistor 32 is at a regulated plus 12 volt potential with respect to the battery negative terminal 20 by virtue of Zener diode 30. This plus 12 volt potential is used to power operational amplifiers to be described hereinafter.

A positive 6 volts is provided by the output of an amplifier 36. A feedback resistor 38 is connected between the output terminal 40 and inverting input terminal 42 of amplifier 36. The reference voltage for the 6 volt supply is formed by the series combination of a resistor 44 and a Zener diode 46 connected between the emitter terminal of transistor 32 and battery negative terminal 20. The junction mediate resistor 44 and Zener diode 46 is connected to the non-inverting input terminal 48 of amplifier 32 resulting in a regulated output voltage of a positive 6 volts referenced to battery negative terminal 20. This positive 6 volts is connected to supply a 6 volts bus.

A binary counter 50, which is commonly referred to as a presetable count-down type, is supplied from the 6 volts developed at terminal 40 of amplifier 36. When the counter state is at a full count, the four output terminals of counter 50 are internally connected to the 6 volt bus. In the zero count state, the four output terminals of counter 50 are internally connected to battery negative. Counting states between full and zero will result in selected terminals being internally connected to the 6 volt bus and the remaining terminals being connected to battery negative. A preset input terminal of counter 50 is connected to a junction mediate a series RC circuit comprising capacitor 49 and a resistor 51 serially connected between terminals 20 and 40, i.e., between battery negative and the 6 volt bus. A current summing amplifier 52 has a non-inverting input terminal connected to the 6 volt bus and a feedback resistor 54 connected between an output terminal 56 and an inverting input terminal 58 provides a means for digital to analog voltage conversion of the output of counter 50. A plurality of resistors 60, 62, 64 and 66 are respectively between each one of the digital output terminals of counter 50 and terminal 58 of amplifier 52. The combination of binary weighted resistors 60, 62, 64 and 66 is chosen in conjunction with feedback resistor 54 such that the output of amplifier 52 is 1 volt above the 6 volt bus when the counter outputs are all in the zero state and the output of amplifier 52 is at a 6 volt level when counter 50 is at a full count.

A signal buffering amplifier 68 has a non-inverting input terminal connected to the 6 volt bus and a feedback resistor 70 connected between an output terminal and an inverting input terminal. A resistor 72 is connected between the inverting input terminal of amplifier 68 and the output terminal 56 of amplifier 52. The output voltage developed by amplifier 68 will range between 6 volts corresponding to a full count of counter 50, and 5 volts, corresponding to a zero count of counter 50.

The output voltage of amplifier 68 is compared to a voltage representative of battery terminal voltage by comparator 74 which has a non-inverting input terminal connected to the output terminal of amplifier 68. An inverting input terminal of comparator 74 is connected to a junction mediate a voltage divider comprising resistors 76 and 78. The relative magnitudes or resistors 76 and 78 are chosen such that the inverting input of comparator 74 is 6 volts when a fully charged battery is subjected to a predetermined discharge current. Capacitor 80 is connected between the inverting input terminal of comparator 74 and the battery negative terminal 20 to suppress the effects of undesirable transient variations in the battery voltage signal applied to amplifier 74.

A comparator 82 has a inverting input terminal connected to receive a voltage signal proportional to battery discharge current from current sensor 14. A non-inverting input terminal of comparator 82 is connected to a slider of a potentiometer 84 which is serially connected with resistors 86 and 88 between the 6 volt bus and terminal 20 of battery 10. The slider of potentiometer 84 is adjusted to provide a voltage to the non-inverting input terminal of comparator 82, which voltage is equal to the magnitude of voltage provided to the inverting input terminal of comparator 74 when the battery discharge current is at a predetermined level.

When the discharge current exceeds the predetermined level the output voltage of comparator 82 will be near zero and when the discharge current is less than the predetermined level, the output voltage of comparator 82 will be near 12 volts.

A clock oscillator 90 provides clock pulses to the counter 50 and may be of any type which can be inhibited by forcing the inhibit input line to a binary zero state. The operating frequency of the clock oscillator is not critical, but a frequency of 10 HZ has been found to operate satisfactorily. The inhibit terminal of oscillator 90 is connected via a diode 92 to an output terminal of comparator 74 and via a diode 94 to an output terminal of comparator 82. Oscillator 90 is inhibited by a low voltage output signal from either comparator 74 or comparator 82. The carry-out output terminal of counter 50 is also connected to the inhibit terminal of oscillator 90 via a diode 96. Thus, a zero carry-out from counter 50 will inhibit operation of oscillator 90.

An amplifier 98 acts as a scaling amplifier for a meter 100 which serves to provide a visual indication of the battery state-of-charge. The non-inverting input terminal of amplifier 98 is connected to the 6 volt bus and the inverting input terminal is connected through a resistor 102 to an output terminal of amplifier 68. A feedback resistor 104 is connected between the output terminal and inverting input terminal of amplifier 98. The relative magnitudes of resistors 102 and 104 are chosen to provide a voltage gains of 6 so that the output of amplifier 98 will range between 6 volts and zero volts as the counting state-of-counter 50 progresses from a full count to a zero count. Meter 100 and a resistor 106 are connected between the output terminal of amplifier 98 and battery negative terminal 20. The magnitude of resistor 106 is chosen to provide full scale deflection of meter 100 when the output potential of amplifier 98 is 6 volts. The deflection of meter 100 is then proportional to the counting state-of-counter 50.

In operation, when the circuit is initially connected to the battery, the charging current of capacitor 49 develops a voltage across resistor 51 providing a binary one at the preset terminal of counter 50 presetting the counter to a full count. Whenever the battery discharge current is less than the predetermined level, the battery voltage signal representative of battery terminal voltage developed mediate resistors 76 and 78 is compared by comparator 74 to a voltage representative of the counter state developed at the output terminal of comparator 68. Should the battery voltage signal be lower than the voltage signal from amplifier 68, the counting state is reduced until the voltage signal from amplifier 68 is lower. Should the circuit be connected to a battery which is not fully charged, initialization of the counter 50 to a full count will result in a fully charged battery indication. However, when the load is connected and the battery discharge current first attains the specified test level corresponding to the adjustment of potentiometer 84, the counting state of counter 50 will be reduced to the proper value thereby correcting the error.

The battery discharge current is monitored by current sensor 14 which provides a voltage proportional to the discharge current magnitude to the inverting input terminal of comparator 82. The non-inverting input terminal of comparator 82 is supplied with a voltage proportional to the specified discharge current level by the adjustment of potentiometer 84. When the discharge current level is greater than the specified value, the output voltage of comparator 82 will be at a low level forward biasing diode 94 and inhibiting the clock oscillator 90. When the battery discharge current is at or below the specified level set by potentiometer 84, the output voltage of comparator 82 is high and diode 94 is reverse biased permitting a comparison of the properly weighted count of counter 50 represented by the output of amplifier 68 and the battery voltage signal by comparator 74.

While the foregoing description has been directed primarily to the determination of the state-of-charge of tractive batteries used in the propulsion of electric vehicles, it will be immediately apparent to those skilled in the art that the present invention is not so limited, and the appended claims are therefore intended to cover the full spirit and scope of the present invention.

What is claimed as new and desired to be secured by Letters Patent of the United States is:

1. A circuit for monitoring the charge state of a battery during a period when the battery is driving a load and battery discharge current is subject to variations over a range of current magnitudes, said circuit comprising:
   a. first sensing means connected in circuit with said battery to produce a first signal proportional to battery discharge current;
   b. second sensing means connected in circuit with said battery to produce a signal proportional to battery terminal voltage;
   c. storage means comprising a signal input adapted to receive said signal proportional to battery terminal voltage, means for storing a signal representative of the signal at said signal input, and an output adapted to supply an electrical signal representative of said stored signal; and
   d. gating means responsive to the value of said first signal and connected in circuit with said storage means to cause said signal proportional to battery voltage to be stored in said storage means solely during time intervals when said first signal has a value representative of a predetermined level within said range of current magnitudes, and to preclude said signal proportional to battery voltage from being stored during intervals when said first signal has another value which is not representative of said predetermined level, whereby the output of said storage means is adapted to supply an updated electrical output signal representative of the level of battery terminal voltage occurring solely during the most recent interval when said battery discharge current is of said predetermined level within said range of current magnitudes.

2. A battery charge indication circuit as defined in claim 1 and including output means connected to the output of said storage means for providing an indication of the last value stored in said storage means and represents the battery state of charge.

3. The invention as claimed in claim 2, wherein said output means comprises an electromagnetic meter for displaying the state-of-charge.

4. The invention as claimed in claim 2, wherein said output means comprises a digital display for indication of the state-of-charge.

5. A circuit for monitoring the charge state of a battery during a period when the battery is driving a load, said circuit comprising:

first sensing means connected in circuit with said battery, said first sensing means producing a first signal proportional to battery discharge current;

second sensing means connected to receive said first signal, said second sensing means producing a gating signal when said first signal attains a predetermined value;

third sensing means connected to said battery, said third sensing means producing a second signal proportional to battery terminal voltage;

a gating circuit including first and second input terminals and an output terminal, said first input terminal being connected to receive said second signal and said second input terminal being connected to receive said gating signal, said gating circuit being responsive to said gating signal to connect said first input terminal to said output terminal for transferring said second signal thereto; and storage means connected to receive said second signal from said gating circuit, said storage means being responsive to each received second signal to be updated thereby.

6. The invention as defined in claim 5, and including output means for indicating the value of said signal in said storage means wherein said value represents the battery state-of-charge.

7. The invention as claimed in claim 5, wherein said storage means comprises an electronic counter.

8. The invention as claimed in claim 5, wherein said output means comprises an electromagnetic meter for displaying the state-of-charge.

9. The invention as claimed in claim 5, wherein said output means comprises a digital display for indication of the state-of-charge.

10. A battery charge indication circuit adapted to determine the state of charge of a rechargeable battery under actual load conditions during which battery discharge current may vary over a wide range of current magnitudes, comprising:
   a. first sensing means connected to sense the magnitude of the battery discharge current and to generate a first signal representative thereof;
   b. second sensing means connected to monitor battery terminal voltage and to generate a second signal representative thereof;
   c. storage means connected to be responsive to said first and second sensing means to retain a value indicative of the magnitude of said second signal during intervals when said first signal is representative of a battery discharge current of predetermined level with said range of current magnitudes;
   d. a count down system adapted to provide an output signal whose value is indicative of the magnitude of said second signal during intervals when said first signal is representative of battery discharge current of predetermined level; and
   e. gating means for reducing the count in said count down system and thus the value of said output signal responsive to said output signal having a value indicative of a voltage of greater magnitude than the value of battery terminal voltage during time intervals when said battery discharge current does not exceed a predetermined magnitude.

11. The apparatus of claim 10 wherein said count down system comprises a presetable count down counter adapted to be preset to a predetermined full count value upon initial energization of said battery charge indication circuit by said battery.

12. The apparatus recited in claim 11 wherein said gating means comprises:
a. first comparison means for comparing said first signal with a reference signal representative of a predetermined value of battery discharge current to produce a first discrete output signal;
b. second comparison means for comparing said output signal with said second signal to produce a second discrete output signal; and
c. clock means responsive to said first and said second discrete output signals to reduce the stored count of said count down counter.

13. The apparatus recited in claim 12 wherein said count down system also comprises digital to analog converting means for converting discrete signals produced by said counter to said output signal having a magnitude indicative of the magnitude of said second signal during intervals when said first signal is representative of said battery discharge current of predetermined level and wherein said first discrete output signal inhibits said clock means for reducing the count of said counter unless said first signal is indicative of a battery discharge current equal to or less than said predetermined level of battery discharge current and wherein said second discrete output signal inhibits said clock means for reducing the count of said counter unless said output signal is indicative of a voltage greater than the battery terminal voltage.

* * * * *